(12) United States Patent
Usukura et al.

(10) Patent No.: US 11,073,692 B2
(45) Date of Patent: Jul. 27, 2021

(54) DISPLAY APPARATUS AND HEAD MOUNT DISPLAY

(71) Applicant: SHARP KABUSHIKI KAISHA, Sakai (JP)

(72) Inventors: Naru Usukura, Sakai (JP); Ryuzo YuKi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 50 days.

(21) Appl. No.: 16/489,809

(22) PCT Filed: Feb. 23, 2018

(86) PCT No.: PCT/JP2018/006605
§ 371 (c)(1),
(2) Date: Aug. 29, 2019

(87) PCT Pub. No.: WO2018/159470
PCT Pub. Date: Sep. 7, 2018

(65) Prior Publication Data
US 2020/0018956 A1 Jan. 16, 2020

(30) Foreign Application Priority Data
Mar. 2, 2017 (JP) .............................. JP2017-039392

(51) Int. Cl.
*G02B 27/01* (2006.01)
*G02F 1/1335* (2006.01)
*G09F 9/30* (2006.01)
*H01L 27/32* (2006.01)

(52) U.S. Cl.
CPC ......... *G02B 27/017* (2013.01); *G02F 1/1335* (2013.01); *G09F 9/30* (2013.01); *H01L 27/3211* (2013.01)

(58) Field of Classification Search
None
See application file for complete search history.

(56) References Cited

U.S. PATENT DOCUMENTS 5,561,538 A 10/1996 Kato et al.
5,764,389 A * 6/1998 Grinberg ................ G02B 5/203
349/106

(Continued)

FOREIGN PATENT DOCUMENTS

JP H09-325204 A 12/1997
JP 3331238 B2 10/2002
(Continued)

*Primary Examiner* — Brian M Butcher
(74) *Attorney, Agent, or Firm* — ScienBiziP, P.C.

(57) ABSTRACT

The present disclosure provides a display apparatus capable of suppressing screen-door effect without requiring alignment between an optical element and a pixel. A display apparatus (1) includes a CF substrate (13) that determines a color of a sub-pixel corresponding to a color element, for each of a plurality of pixels, and a lenticular lens (14) that widens a full width at half maximum of luminance of emitted light more than a full width at half maximum of luminance of light incident from the CF substrate, in which the lenticular lens has a periodic structure smaller than a periodicity of arrangement of sub-pixels.

18 Claims, 9 Drawing Sheets

(56) References Cited

U.S. PATENT DOCUMENTS

| | | | | |
|---|---|---|---|---|
| 5,808,599 A * | 9/1998 | Allio | ................ | H04N 13/10 345/6 |
| 6,075,581 A | 6/2000 | Shirochi | | |
| 6,127,998 A * | 10/2000 | Ichikawa | ............. | G09G 3/3648 345/100 |
| 6,219,113 B1 * | 4/2001 | Takahara | .............. | G02F 1/1334 345/98 |
| 6,266,038 B1 * | 7/2001 | Yoshida | ............... | G09G 3/3659 345/100 |
| 9,626,145 B1 * | 4/2017 | Fu | ........................ | G09G 3/3426 |
| 10,412,363 B1 * | 9/2019 | Burnett, III | ........ | H04N 9/04519 |
| 10,502,950 B2 * | 12/2019 | Kikuchi | .................. | G02B 25/00 |
| 2002/0033909 A1 * | 3/2002 | Hiyama | ............... | G02B 6/0055 349/65 |
| 2003/0016444 A1 * | 1/2003 | Brown | ................. | H04N 13/349 359/462 |
| 2004/0066363 A1 * | 4/2004 | Yamano | ................... | G09G 3/20 345/98 |
| 2006/0170616 A1 * | 8/2006 | Hirayama | ........... | H04N 13/324 345/32 |
| 2007/0058258 A1 * | 3/2007 | Mather | .................. | G02B 27/10 359/619 |
| 2008/0225205 A1 * | 9/2008 | Travis | .................. | G02B 6/0068 349/65 |
| 2014/0015866 A1 * | 1/2014 | Teranishi | ............. | G09G 3/2007 345/690 |
| 2014/0022499 A1 * | 1/2014 | Tamaki | ............... | G02F 1/13439 349/106 |
| 2014/0092080 A1 * | 4/2014 | Fukunaga | ............ | G09G 3/3696 345/212 |
| 2014/0125933 A1 * | 5/2014 | Tamaki | ................. | G02F 1/1396 349/114 |
| 2014/0285761 A1 * | 9/2014 | Tamaki | ................. | G09G 3/3659 349/144 |
| 2016/0042676 A1 * | 2/2016 | Berkeley | ................ | G09G 3/006 345/589 |
| 2016/0150221 A1 * | 5/2016 | Lee | ....................... | H04N 13/307 348/59 |
| 2017/0153513 A1 * | 6/2017 | Tamaki | ................ | G09G 3/2003 |
| 2017/0176796 A1 * | 6/2017 | Tamaki | ................ | G02F 1/13336 |
| 2017/0249910 A1 * | 8/2017 | Tamaki | ............. | G02F 1/136209 |
| 2017/0269413 A1 * | 9/2017 | Tamaki | ............. | G02F 1/133504 |
| 2018/0088349 A1 | 3/2018 | Sakohira et al. | | |
| 2018/0203242 A1 * | 7/2018 | Takeuchi | ............... | G02B 30/27 |
| 2018/0275398 A1 | 9/2018 | Kikuchi et al. | | |
| 2019/0149761 A1 * | 5/2019 | Cai | ..................... | H02M 1/4208 348/730 |
| 2019/0250439 A1 * | 8/2019 | Urey | ................. | G02B 27/0172 |

FOREIGN PATENT DOCUMENTS

| | | |
|---|---|---|
| JP | 2009-265406 A | 11/2009 |
| JP | 4959307 B2 | 6/2012 |
| JP | 2016-139112 A | 8/2016 |
| JP | 2016-224364 A | 12/2016 |
| WO | 2017/002278 A1 | 1/2017 |

* cited by examiner

DISPLAY APPARATUS AND HEAD MOUNT DISPLAY

TECHNICAL FIELD

The present disclosure relates to a display apparatus and a head mount display using the display apparatus.

BACKGROUND ART

Conventionally, a display apparatus called a head mount display (HMD) that enlarges and displays an image over the entire field of view of a user has been known. In the HMD, an eyepiece is provided in front of a display screen, and an image to be displayed on the display screen is enlarged by the eyepiece. A liquid crystal display (LCD) or an organic electro luminescence (EL) display (OLED) is used for the display screen of the HMD.

In the LCD, for example, a substrate is provided including color filters (CF) of red (R), green (G) and blue (B), which are color elements for display. As color elements, in addition to R, G, and B stated above, a color such as white 00 or yellow (Ye) may be added. In the CF substrate, a black matrix (BM) for preventing color mixing is disposed between the respective colors.

As described above, in the HMD, the image displayed on the display screen is enlarged. Consequently, in the HMD, a problem that dark areas resulting from a BM, which are not visually recognized in a normal display, are visually recognized has occurred. Further, in a case of performing display in a single color such as R, G or B, the other two colors are in a non-lighting state. Portions in such a non-lighting state become dark areas similarly to the black matrix. The phenomenon in which such dark areas occur is generally called "screen-door effect".

PTL 1 describes a display apparatus in which, in order to eliminate a stripe pattern caused by the black matrix, on a surface of a substrate of a liquid crystal panel, a microlens array 5 consisting of a plurality of microlenses formed corresponding to respective pixels of the liquid crystal panel is formed.

CITATION LIST

Patent Literature

PTL 1: Japanese Patent No. 3331238 (issued on Oct. 7 2002)

PTL 2: Japanese Patent No. 4959307 (issued on Jun. 20, 2012)

SUMMARY OF INVENTION

Technical Problem

However, in the related art described in PTL 1, since the microlens is formed corresponding to each pixel of the liquid crystal panel, it is necessary to perform alignment between the microlens array and the pixels.

Considering the above problems, one aspect of the present disclosure is to provide a display apparatus capable of suppressing screen-door effect without requiring alignment between an optical element and a pixel.

Solution to Problem

In order to solve the problem stated above, a display apparatus according to one aspect of the present disclosure is a display apparatus having a plurality of pixels and including: a color layer that determines a color of a sub-pixel corresponding to a color element, for each of the plurality of pixels; and an optical element that is provided parallel to the color layer and widens a full width at half maximum of luminance of emitted light more than a full width at half maximum of luminance of light incident from the color layer, in which sub-pixels are arranged to have a periodicity in at least one direction, and the optical element has a periodic structure smaller than the periodicity of arrangement of the sub-pixels.

Further, a display apparatus according to one aspect of the present disclosure is a display apparatus having a plurality of pixels and including: a color layer that determines a color of a sub-pixel corresponding to a color element, for each of the plurality of pixels; and an optical element provided parallel to the color layer, in which the optical element anisotropically scatters light incident from the color layer.

Advantageous Effects of Invention

According to one aspect of the present disclosure, it is possible to provide a display apparatus capable of suppressing screen-door effect without requiring alignment between an optical element and a pixel.

BRIEF DESCRIPTION OF DRAWINGS

FIG. 3(a) is a diagram of a conventional display apparatus, and FIG. 3(b) is a diagram of the display apparatus according to the first embodiment.

DESCRIPTION OF EMBODIMENTS

In the following description, a direction from a display apparatus according to each embodiment to a user is referred to as a z-direction, and directions perpendicular to the z-direction and perpendicular to each other are referred to as an x-direction and a y-direction.

First Embodiment

Hereinafter, an embodiment of the present disclosure will be described in detail with reference to FIGS. 1 to 6.

Figure 1:
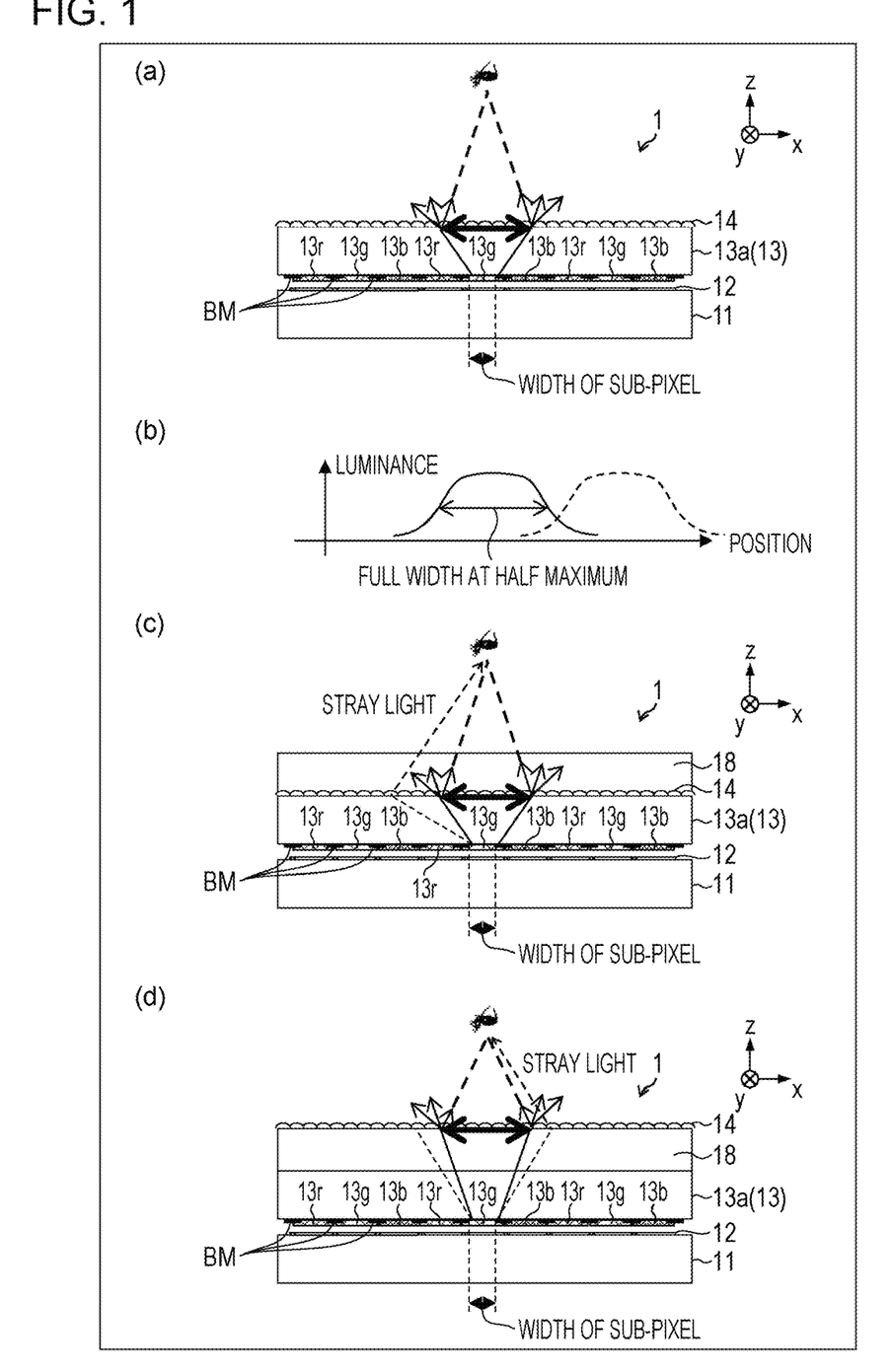
FIG. 1(a) is a sectional view illustrating a configuration of a display apparatus according to a first embodiment.
FIG. 1(b) is a graph illustrating a distribution of luminance of green light.
FIG. 1(c) is a sectional view illustrating a display apparatus in which a polarizing plate is provided on an emission side of a lenticular lens.
FIG. 1(d) is a sectional view illustrating a display apparatus in which a polarizing plate is provided between a lens element and a glass substrate.
Figure 2:
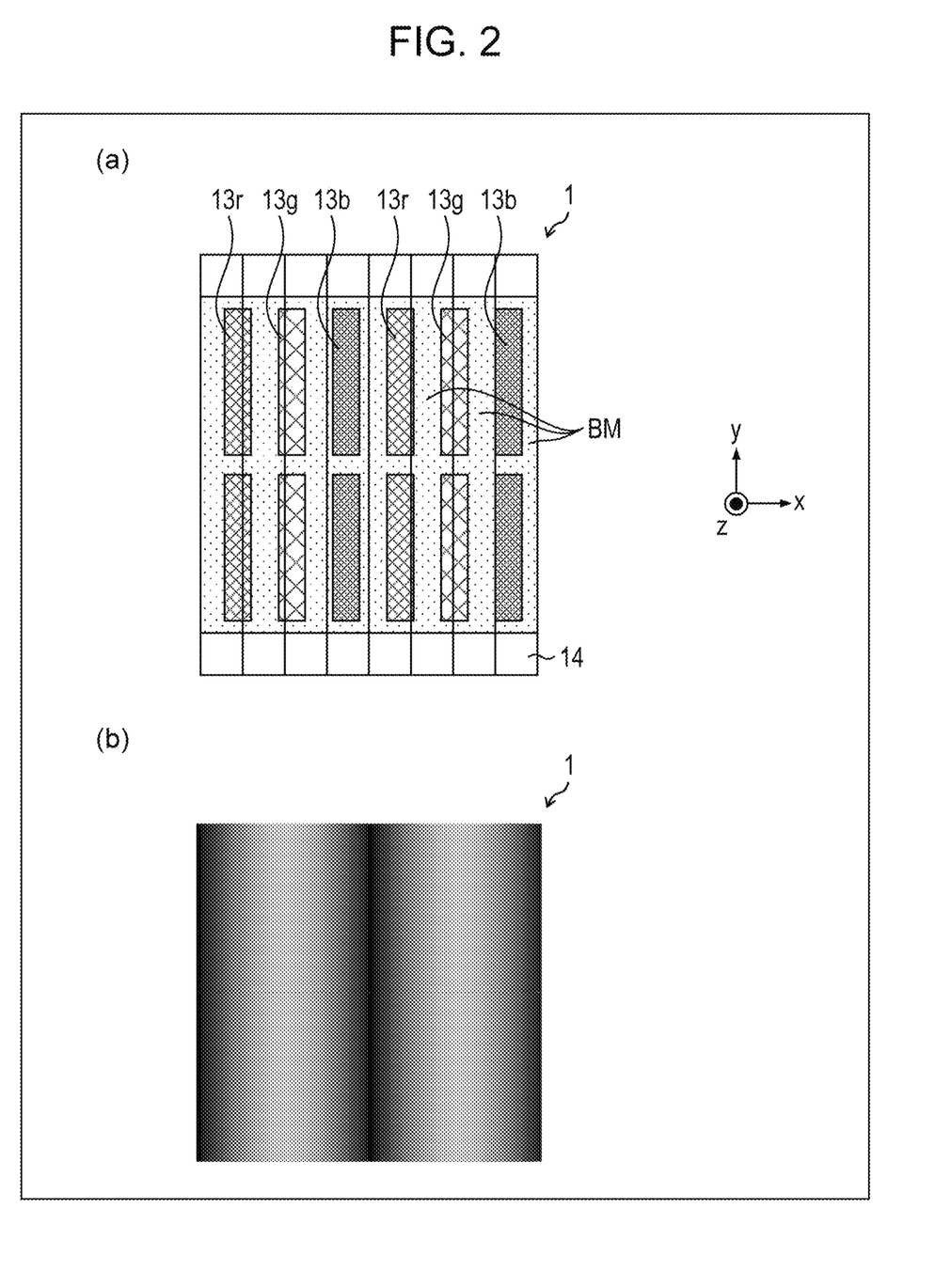
FIG. 2(a) is a top view illustrating arrangement of pixels on a CF substrate.
FIG. 2(b) is a diagram illustrating a state in which the display apparatus performs display in a single color G.

FIG. 1(a) is s a sectional view illustrating a configuration of a display apparatus 1 according to the present embodiment. The display apparatus 1 is a display apparatus having a plurality of pixels. The display apparatus 1 is a display apparatus used for, for example, a head mount display (HMD). Therefore, the display apparatus 1 is a high-definition display apparatus (for example, with a resolution of 450 to 1000 dpi, or higher) as compared with a display apparatus (for example, with a resolution of 300 to 500 dpi) used for a smartphone or the like. As shown in FIG. 1, the display apparatus 1 includes a backlight 11 (light source), a TFT (thin film transistor) substrate 12, a CF (color filter) substrate 13 (color layer, color filter), and a lenticular lens 14 (optical element) are arranged in this order in the z-direction.

The backlight 11 is a backlight that emits light to the CF substrate 13. The backlight 11 is preferably narrow directional in a direction of a periodic structure of the lenticular lens 14, or in a direction within ±20° with respect to the direction of the periodic structure. Specifically, the backlight 11 preferably has a full angle at half maximum of luminance of 30° or less at least in a direction of a periodicity of arrangement of sub-pixels described later. The TFT substrate 12 is a substrate provided with a thin film transistor that controls transmission of light emitted from the backlight 11 for each sub-pixel.

The CF substrate 13 determines a color of a sub-pixel corresponding to a color element of each of the plurality of pixels of the display apparatus 1. The CF substrate 13 of the present embodiment has a configuration in which a R (red) filter 13r, a G (green) filter 13g, and a B (blue) filter 13b are periodically arranged in the x-direction (at least one direction) on a surface facing the TFT substrate 12, of a glass substrate 13a. In addition, a substrate formed with another material (resin or the like), which is light transmissive, instead of the glass substrate 13a. Further, the color of the filter included in the CF substrate 13 is not limited to the examples stated above, and the CF substrate 13 may further include a W (white) filter, for example.

In the display apparatus 1, one pixel includes three sub-pixels, and any of the R filter 13r, the G filter 13g, and the B filter 13b is provided corresponding to each of the three sub-pixels. A black matrix BM for preventing color mixing is provided between each two of the A filter 13r, the G filter 13g, and the B filter 13b, which are adjacent to each other in the x-direction. As used in the specification, the term "sub-pixel width" means a width of a region of a filter corresponding to the sub-pixel, which is not covered by a black matrix BM.

A black matrix BM is also provided between the R filters 13r, the G filters 13g, and the B filters 13b, which are adjacent to each other in the y-direction. A width of the black matrix BM in a direction perpendicular to a periodic direction of the plurality of pixels included in the display apparatus 1 is preferably 10 μm or less, or 30% or less of a length of one period of the sub-pixel. Consequently, it is possible to suppress occurrence of black lines due to the black matrix BM between the filters which are adjacent to each other in the y-direction. Therefore, in the display apparatus 1, the screen-door effect can be effectively suppressed while suppressing the black lines due to the black mat BM by the lenticular lens 14 described later.

The lenticular lens 14 is an optical element that widens a full width at half maximum of luminance of emitted light more than a full width at half maximum of luminance of light incident from the CF substrate 13. That is, the lenticular lens 14 is an optical element that uses light transmitted through the CF substrate 13 as the incident light, and uses, as the emitted light, light having larger full width at half maximum of the luminance in the direction of the periodicity of each filter included in the CF substrate 13 than that of the incident light.

In the lenticular lens 14 of the present embodiment, a plurality of lens elements extending in the y-direction are formed so as to be convex toward a light emission side on a surface of the glass substrate 13a (light transmissive member) of the CF substrate 13 and to be aligned in the x-direction. Further, the lenticular lens 14 may be formed on a surface of the light transmissive member parallel to the CF substrate 13 and different from the glass substrate 13a so as to be convex toward the light emission side.

The lenticular lens 14 has the periodic structure smaller than the periodicity of the CF substrate 13. In other words, the lenticular lens 14 has the periodic structure smaller than the periodicity of arrangement of the sub-pixels of the plurality of pixels included in the display apparatus 1. That is, in a case where a width of the lens element 14a in the x-direction is P1 and the period of the CF substrate 13 is Pp, $Pp = m \times P1$ ($m > 1$) is satisfied. Here, m may be a non-integer. Furthermore, it is preferable that the periodic structure of the lenticular lens 14 be smaller than a width of the filter having the largest width in the x-direction among the R filter 13r, the G filter 13g, and the B filter 13b.

With the lenticular lens 14 having such a periodic structure, it is not necessary to perform highly accurate alignment between the lenticular lens 14 and the CF substrate 13. That is, the display apparatus 1 can suppress the screen-door effect with an alignment-free configuration.

In a case of an LCD for the HMD, the width of the sub-pixel is 20 μm or less. In addition, a thickness of the glass substrate 13a may be, for example, 100 μm or more. Specific examples of each value will be described later.

Moreover, the display apparatus 1 may include a polarizing plate 18 that transmits light only polarized in a specific direction on an emission side of the lenticular lens 14, or between the lens element 14a and the glass substrate 13a. A direction of the polarized tight transmitted through the polarizing plate 18 is not particularly limited.

FIG. 1(c) is a sectional view illustrating the display apparatus 1 in which the polarizing plate 18 is provided on the emission side of the lenticular lens 14. As shown in FIG. 1(c), in a case where the polarizing plate 18 is positioned on the emission side of the lenticular lens 14, a distance between the lenticular lens 14 and the CF substrate 13 is short. Consequently, the light emitted from the CF substrate 13 is less likely to spread excessively, and it is difficult to cause degradation of the image quality due to stray light scattered in valleys or surface of the lenticular lens. On the other hand, there is a problem that contrast of an image displayed on the display apparatus 1 is easily degraded.

FIG. 1(d) is a sectional view illustrating the display apparatus 1 in which the polarizing plate 18 is provided between the lens element 14a and the glass substrate 13a. As shown in FIG. 1(d), in a case where the polarizing plate 18 is positioned between the lens element 14a and the glass substrate 13a, the distance between the lens element 14a and the CF substrate 13 is long. Consequently, the light emitted from the CF substrate 13 is likely to spread excessively, and the image quality is likely to be degraded by the stray light scattered in the valleys or surface of the lenticular lens. On the other hand, there is an advantage that contrast of the image displayed on the display apparatus 1 does not easily degrade.

FIG. 1(b) is a diagram illustrating luminance distribution of green light emitted from sub-pixels corresponding to two G filters 13g adjacent to each other and included in the display apparatus 1. In a case where the specification describes that sub-pixels with a specific color are "adjacent", sub-pixels with a color other than the specific color may be present between those sub-pixels. Although FIG. 1(b) illustrates the luminance of the pixel that emits green light, change in luminance is the same for the pixels that emit red light or blue light.

In the display apparatus 1, the full width at half maximum of the luminance of the green light on an emission surface side of the lenticular lens 14 is twice or more the width of the sub-pixel. Consequently, in the display apparatus 1, the overlap between the luminance distribution of the green light emitted from a certain sub-pixel, indicated by a solid line in FIG. 1(b), and the luminance distribution of the green light emitted from a sub-pixel adjacent to the certain sub-pixel, indicated by a broken line in FIG. 1(b), is large. Therefore, a region between the two sub-pixels is less likely to be dark.

FIG. 2(a) is a top view illustrating arrangement of the pixels of the CF substrate 13. As described above, in the CF substrate 13, the R filter 13r, the G filter 13g, and the B filter 13b are periodically arranged in the x-direction. On the other hand, in the y-direction, one of the R filter 13r, the G filter 13g, and the B filter 13b is continuously arranged.

FIG. 2(b) is a diagram illustrating a state in which the display apparatus 1 performs display in the single color G. In a state where the display apparatus 1 performs display in the single color G, regions of the R filter 13r and the B filter 13b are in the non-lighting state where light is not emitted. However, as described above, since the full width at half maximum in the x-direction of the luminance of the light emitted from the lenticular lens 14 is twice or more the width in the x-direction of the G filter 13g, a region between the G pixels adjacent to each other is less likely to be dark as shown in FIG. 2(b). That is, in the display apparatus 1, the screen-door effect due to the black matrix BM and the sub-pixel in the non-lighting state is suppressed.

Figure 3:
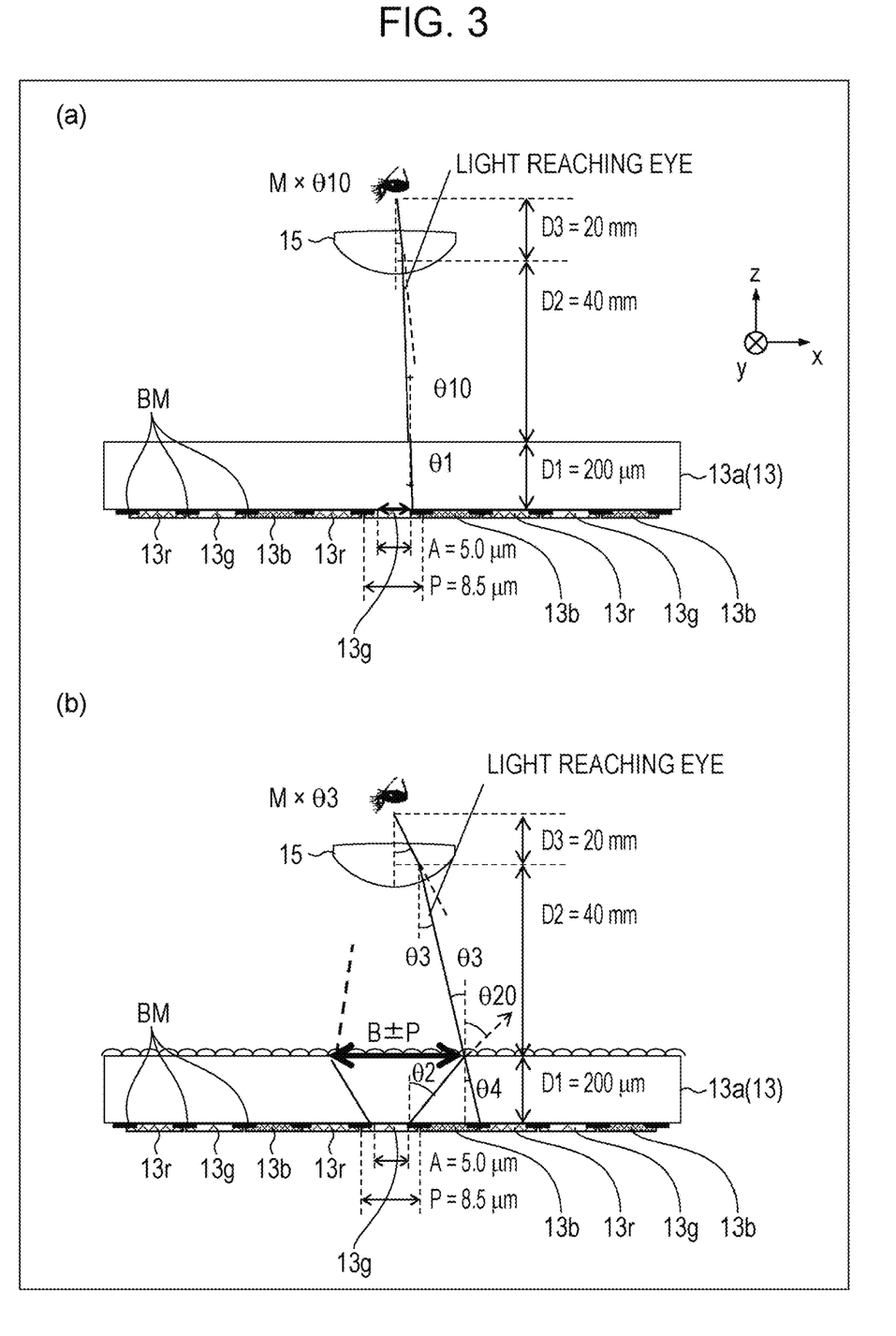
FIG. 3 includes diagrams illustrating an example of a specific shape of a lenticular lens.

FIG. 3 includes diagrams illustrating an example of a specific shape of the lenticular lens 14. FIG. 3(a) is a diagram of a conventional display apparatus, and FIG. 3(b) is a diagram of the display apparatus 1 according to the present embodiment. In FIG. 3, the respective values are as follows.

A=5 μm (width of the sub-pixel)
P=8.5 μm (width of individual filter)
D1=200 μm (thickness of the glass substrate 13a)
D2=40 mm (distance from a surface of the glass substrate 13a to an eyepiece 15)
D3=20 mm (distance from the eyepiece 15 to user's eye)

A boundary between D2 and D3 is a point of intersection in a case where light rays before and after passing through the eyepiece 15 are extended.

As for D2, although an optical path length changes depending on a refractive index of the eyepiece 15, change in the optical path length is ignored in the following description for simplicity. Further, magnification of an image by the eyepiece 15 is M, and in the following description, M is 3. Moreover, although the image seen the user is a virtual image magnified by the eyepiece 15, only a geometrical relationship is considered in the following description. For example, a width A of the sub-pixel is 15 μm when viewed through the eyepiece 15 with the magnification M of 3, however is considered to be 5 μm in the following description. Further, a human pupil generally has a size of about 2 to 6 mm. However, for simplicity in the following description, a size of the user's pupil is ignored.

In the conventional display apparatus shown in FIG. 3(a), light emitted from a sub-pixel at an angle θ1 is emitted into the air at an emission angle θ10 after passing through the glass substrate 13a of a thickness D1, and reaches the user's eye separated by a distance D2+D3. On the other hand, light emitted at an angle larger than the angle θ1 does not reach the user's eye. Consequently, the user sees light of a width corresponding to the width A of the sub-pixel. In this case, the screen-door effect occurs when the adjacent sub-pixel is not lit.

On the other hand, in the display apparatus 1 of the present embodiment shown in FIG. 3(b), light emitted from a sub-pixel at an angle θ2 larger than the angle θ1 reaches the user's eye. Specifically, as shown in FIG. 3(b), the light emitted from the sub-pixel at the angle θ2 is emitted from the CF substrate 13 at an emission angle θ20 in a case where the lenticular lens 14 is not present, thus the light does not reach the user's eye. However, since the display apparatus 1 includes the lenticular lens 14, the light emitted from the sub-pixel at the angle θ2 is emitted toward the user's eye at an emission angle θ3. Accordingly, it appears to the user's eyes that the light is coming at an angle of M×θ3.

In a case where a color arrangement period is set to B=3×P−25.5 μm, in order to maintain the resolution of the display apparatus 1, it is preferable that light in a range of +B/2 from a center of a sub-pixel in a periodic direction of the sub-pixel reach the user's eye. However, the range may slightly overlap with adjacent sub-pixels of the same color.

Hereinafter, the above-described preferable states will be described using relational expressions. In this case, the light satisfies the following Expression (1):

$$D3 \times \tan(M \times \theta 3) + D2 \times \tan(\theta 3 + D1 \times \tan(\theta 4) \leq B/2 \quad (1)$$

Here, θ4 is an incident angle of the light to the lenticular lens 14 in a case where the light from a position B/2 away from the center of the sub-pixel reaches the user's eye.

In a case where the refractive index of the glass substrate 13a is n1=1.5, and the refractive index of the air is n2=1.0, the following Expression (2) is established:

$$n1 \times \sin(\theta 4) = n2 \times \sin(\theta 3) \quad (2)$$

From the Expression (2), the following Expression (3) for tan(θ4) is derived:

$$\tan(\theta 4) = \sin(\theta 4)/\sqrt{(1-\sin^2(\theta 4))} = n2/n1 \times \sin(\theta 3)/\sqrt{(1-(n2/n1)^2 \times \sin^2(\theta 3))} \quad (3)$$

Further, in a case where θ3 is small, an approximation of the following Expression (4) is established:

$$\tan(M \times \theta 3) = M \times \tan(\theta 3) \quad (4)$$

From the Expressions (1), (3) and (4), in the above-mentioned preferable states, the following Expression (5) for θ3 is established:

$$(D3 \times M + \theta2) \times \tan(\theta3) + D1 \times n2/n1 \times \sin(\theta3)/\sqrt{(1-(n2/n1)^2 \times \sin^2(\theta3))} \leq B/2 \quad (5)$$

On the other hand, for θ2, the following Expression (6) is established:

$$D1 \times \tan(\theta2) = B/2 - A/2 \leftrightarrow D1 \times \tan(\theta2) + A/2 = B/2 \quad (6)$$

By A, B, and D1 to D3 in the Expressions (5) and (6) being substituted by those described above for the preferable states, θ3=0.007° and θ2=2.9° are calculated. That is, the lenticular lens 14 may have any shape as long as the light having an incident angle θ2=2.9° is emitted at an emission angle θ3=−0.007°. For the lenticular lens 14 satisfies this condition, for example, a pitch of the lenticular lens 14 may be 3.0 μm, a curvature may be 100 μm, and a height may be 0.11 μm. Moreover, it is preferable that an inclination of a rising portion of the lens element 14a in a section perpendicular to an extending direction of the lenticular lens 14 be, for example, 8.7°.

The above-mentioned values for the lenticular lens 14 represent one of be preferred examples and do not limit the scope of the invention. The pitch of the lenticular lens 14 in the periodic direction is preferably 1 μm to 25 μm. The curvature of the lenticular lens 14 is preferably 20 μm to 2000 μm. The height of the lenticular lens 14 is preferably 3 μm or less. Further, the inclination of the rising portion of the lens element 14a is preferably 5° to 15°. Consequently, the full width at half maximum of the luminance of the green light on the emission surface side of the lenticular lens 14 is made twice or more the width of the sub-pixel.

Figure 4:
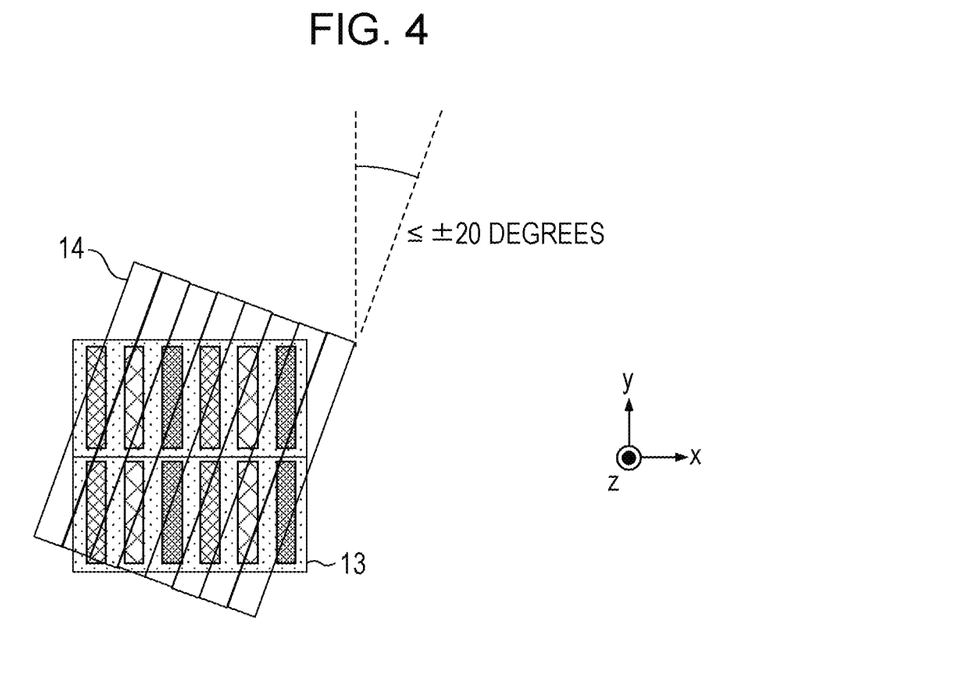
FIG. 4 is a diagram illustrating another example of arrangement of the lenticular lens in the display apparatus according to the first embodiment.

FIG. 4 is a diagram illustrating another example of arrangement of the lenticular lens 14 in the display apparatus 1. As described above, in the display apparatus 1, a width P1 of the lens element 14a (that is, the period of the lenticular lens 14) does not coincide with a period Pp of arrangement of the filters in the CF substrate 13. Consequently, in a case where the periodic direction of the CF substrate 13 and the periodic direction of the lenticular lens 14 coincide with each other, depending on a correlation between P1 and Pp, there is a possibility that moire fringes may be genera ted due to interference in the image displayed by the display apparatus 1.

As a method of suppressing moire fringes, the lenticular lens 14 may be arranged in a state of being rotated in a plane parallel to the CF substrate 13. At this time, as a rotation angle of the lenticular lens 14 is larger, effect of suppressing moire fringes becomes larger. However, on the other hand, spread of light in the y-direction becomes larger, thereby causing degradation of the image quality of the display apparatus 1. In order to suppress moire fringes and not to degrade the image quality, it is preferable that the rotation angle of the lenticular lens 14 with respect to the CF substrate 13 be set to ±20° or less as shown in FIG. 4.

MODIFIED EXAMPLE

Figure 5:
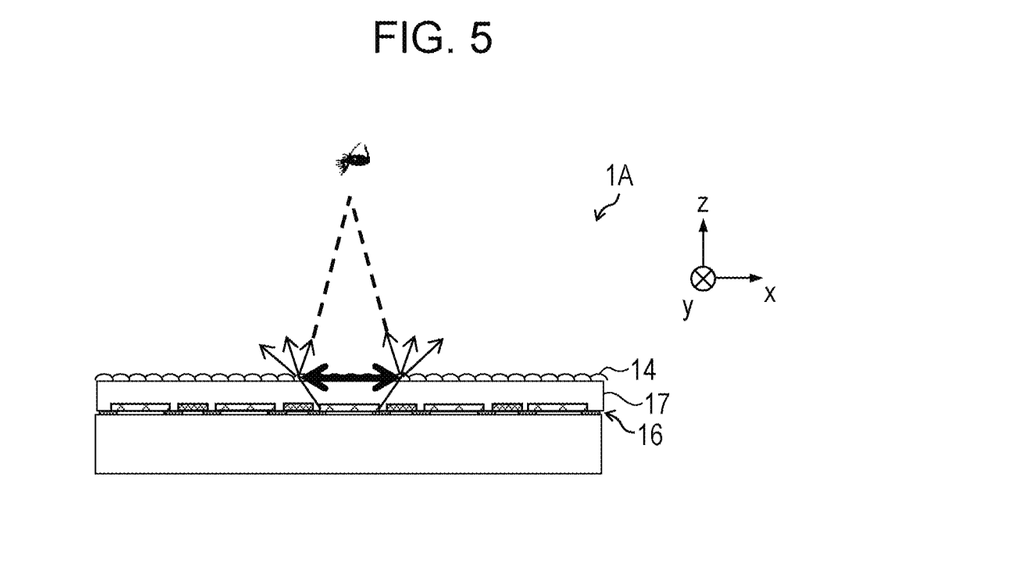
FIG. 5 is a sectional view of a display apparatus according to a modified example of the first embodiment.
Figure 6:
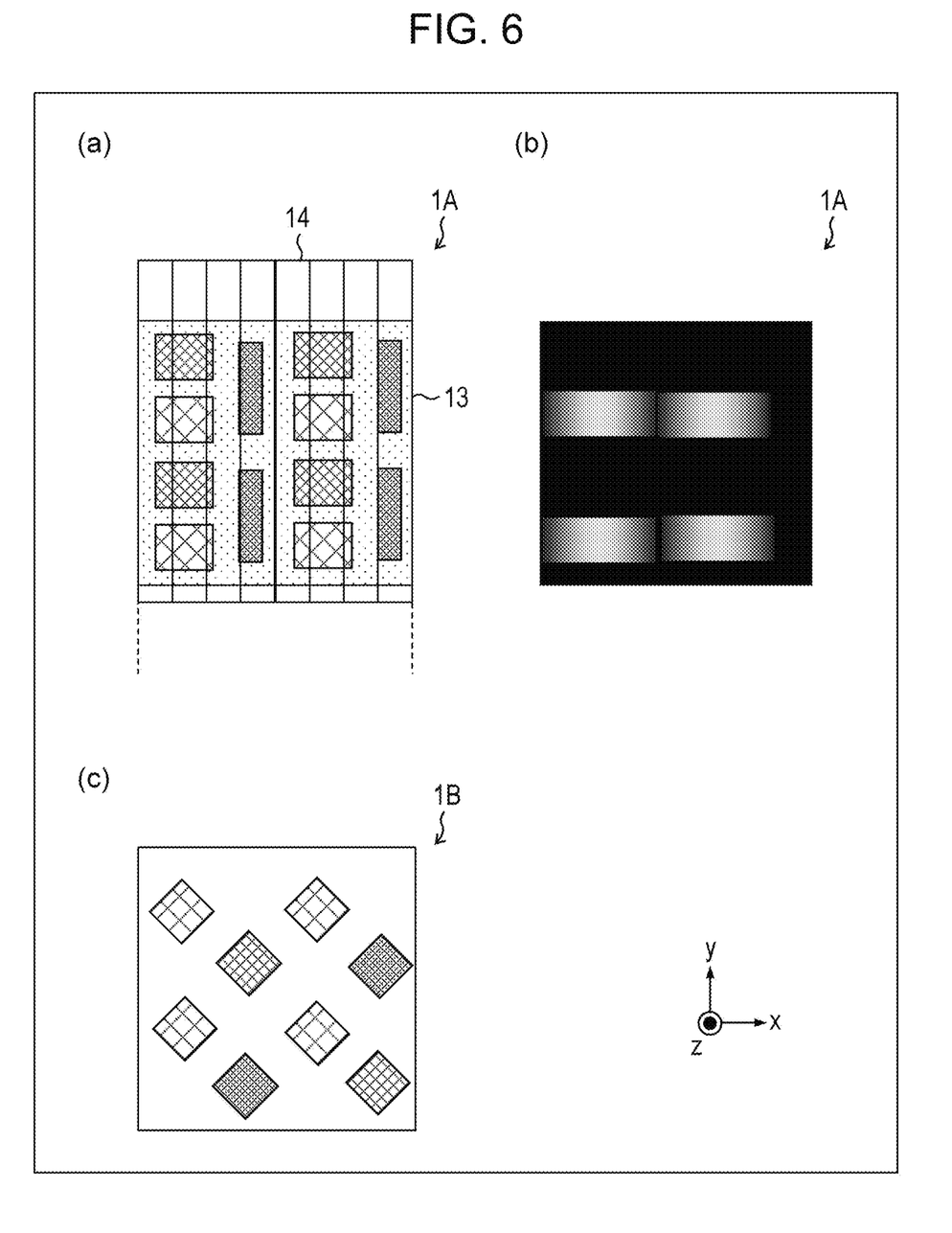
FIG. 6(a) is a top view illustrating arrangement of sub-pixels in the display apparatus according to the modified examples of the first embodiment.
FIG. 6(b) is a top view illustrating a state where display is performed in the single color G in the display apparatus illustrated in FIG. 6(a)
FIG. 6(c) is a top view illustrating another arrangement of sub-pixels in the display apparatus according to the modified example of the first embodiment.

The first embodiment stated above has demonstrated the display apparatus 1 which is the LCD. In this modified example, a display apparatus 1A which is an OLED will be described. OLED is difficult to achieve high definition compared to the LCD, and even in a case of the display apparatus for the HMD, the resolution is, for example, about 450 dpi.

FIG. 5 is a sectional view of the display apparatus 1A according to this modified example. As shown in FIG. 5, the display apparatus 1A includes a TFT/OLED substrate 16 (color layer), an opposing substrate 17, and the lenticular lens 14.

The TFT/OLED substrate 16 is a substrate provided with a self-emitting OLED and a TFT for controlling the OLED. Light emitted from the TFT/OLED substrate 16 preferably has a full angle at half maximum of luminance of 30° or less in the direction of the periodicity of arrangement of sub-pixels, similar to the backlight 11. The opposing substrate 17 is a substrate for sealing and protecting the TFT/OLED substrate 16, and is also called a sealing layer.

FIG. 6(a) is a top view illustrating arrangement of sub-pixels in the display apparatus 1A. In the display apparatus 1 which is the LCD, R, G and B filters are arranged in stripes. However, since the display apparatus 1A is the OLED, it is difficult to form a stripe-like pixel arrangement from the viewpoint of circuit arrangement of the TFT and the like. Consequently, in the TFT/OLED substrate 16, as shown in FIG. 6(a), R or G pixels and B pixels are alternately arranged in the x-direction, while in the y-direction, R and G pixels are alternately arranged or B pixels are continuously arranged. Such an arrangement of the pixels is called S-stripe arrangement.

FIG. 6(b) is a top view illustrating a state in which display is performed in the single color G in the display apparatus 1A shown in FIG. 6(a). The full width at half maximum of the luminance in the y-direction of the light emitted 1 from the lenticular lens 14 is less likely to change before and after passing through the lenticular lens 14. Consequently, in the display apparatus 1A, it is impossible to suppress the black lines periodically appearing in the y-direction. However, as shown in FIG. 6(b), also in the display apparatus 1A, it is possible to suppress the black lines periodically appearing in the x-direction between G filters adjacent to each other.

FIG. 6(c) is a top view illustrating another arrangement of sub-pixels in the display apparatus 1A. The lenticular lens 14 is omitted in FIG. 6(c). As the arrangement of sub-pixels in the display apparatus 1A which is the OLED, in addition to the S-stripe arrangement, arrangement called pentile arrangement as shown in FIG. 6(c) is also conceivable. In the pentile arrangement, the sub-pixels are arranged in a state of being inclined at an angle of 45° with respect to a horizontal direction and a vertical direction in the display apparatus 1. Therefore, the black lines due to the black matrix BM also appear as black lines similarly inclined at an angle of 45°. In a case where the arrangement of the pixels is the pentile arrangement, although the effect is small compared to the display apparatus 1, it is also possible to suppress the black lines due to the black matrix BM.

As described above, by providing the lenticular lens 14 of the present embodiment in the display apparatus 1A which is the OLED, the screen-door effect can be suppressed although the effect is smaller than that of the display apparatus 1 which is the LCD. Further, since the display apparatus 1A is the OLED, there is no need to provide the backlight 11, and the number of components can be reduced.

Second Embodiment

Another embodiment of the present disclosure will be described based on FIG. 7 as follows. Additionally, for the convenience of the description, members which have the same functions as the members described in the embodiment stated above will be denoted by the same symbols and the descriptions thereof will be omitted.

Figure 7:
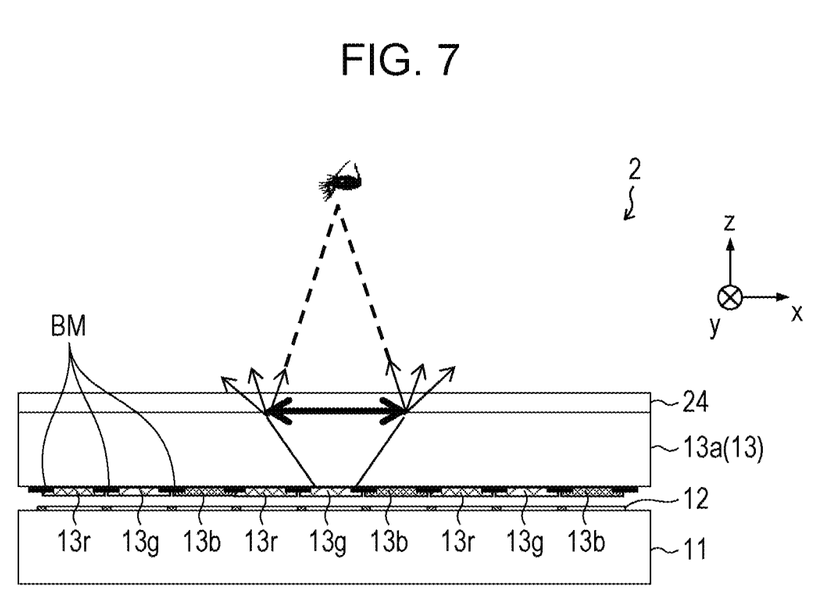
FIG. 7 is a sectional view illustrating a configuration of a display apparatus according to a second embodiment.

FIG. 7 is a sectional view illustrating a configuration of a display apparatus 2 according to the present embodiment.

The display apparatus 2 is different from the display apparatus 1 in that the display apparatus 2 includes an anisotropic scattering member 24 (optical element) instead of the lenticular lens 14.

The anisotropic scattering member 24 is an optical element that anisotropically scatters incident light. The anisotropic scattering member 24 of the present embodiment emits the incident light with scattering the incident light largely in the x-direction and almost no scattering in the y-direction. Specifically, in the anisotropic scattering member 24, a full width at half maximum of luminance in the x-direction on an emission surface side of the anisotropic scattering member 24 is made twice or more the width of the sub-pixel, similar to the lenticular lens 14. On the other hand, a full angle at half maximum of the luminance in the y-direction of the light emitted from the anisotropic scattering member 24 is preferably 30° or less. As such an anisotropic scattering member 24, for example, a light diffusion film using a needle-like filler (filler) described in PTL 2 can be suitably used.

Specifically, the anisotropic scattering member 24 has needle-like fillers for scattering light and a matrix for sealing the needle-like fillers. A difference between a refractive index of the needle-like filler and a refractive index of the matrix is preferably 0.1 or more. A short diameter of the needle-like filler is preferably 0.1 μm or more. Moreover, it is preferable that an aspect ratio of the needle-like filler be 10 to 1000. Moreover, it is preferable that the anisotropic scattering member 24 have a needle-like filler content of 50 mass % to 80 mass %.

Such a display apparatus 2 can also achieve the same effect as the display apparatus 1 described above.

Third Embodiment

Another embodiment of the present disclosure will be described based on FIGS. 8 and 9 as follows.

Figure 8:
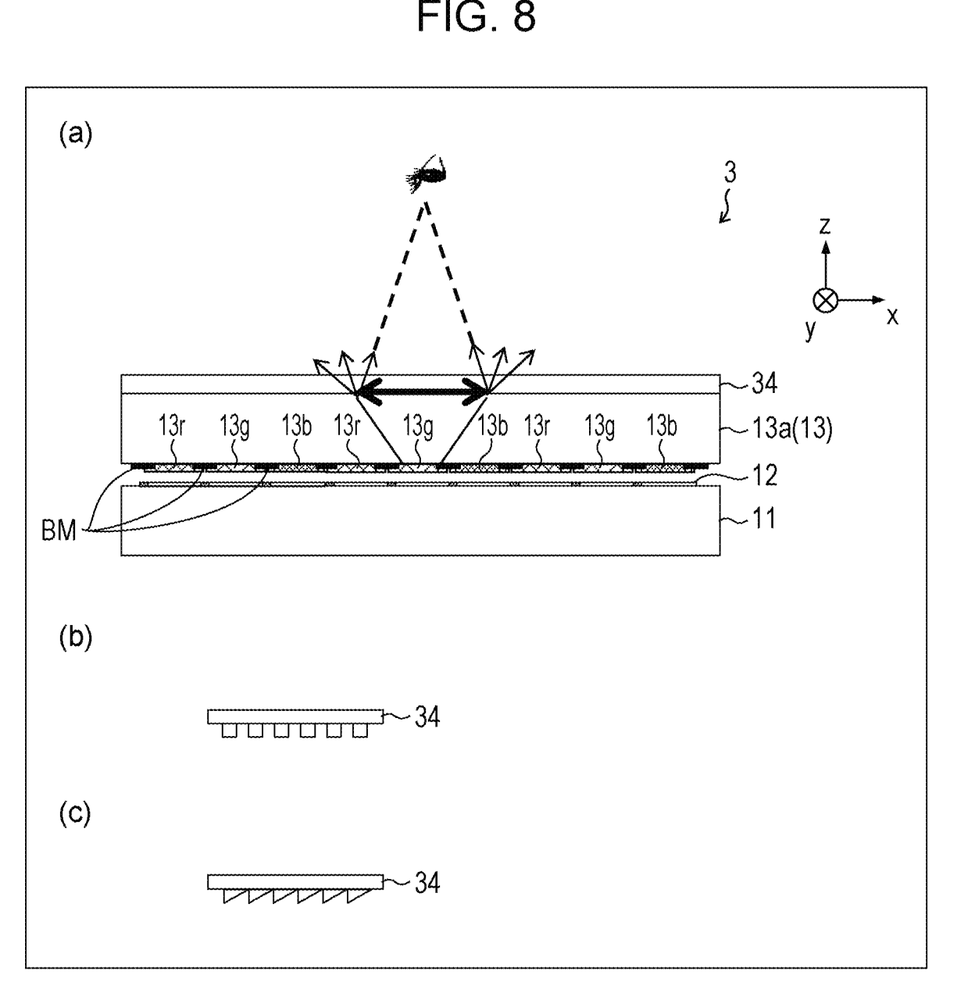
FIG. 8(a) is a sectional view illustrating a configuration of a display apparatus according to a third embodiment.
FIG. 8(b) is a sectional view illustrating an example of a diffraction grating.
FIG. 8(c) is a sectional view illustrating another example of a diffraction grating.

FIG. 8($a$) is s a sectional view illustrating a configuration of a display apparatus 3 according to the present embodiment. The display apparatus 3 is different from the display apparatus 1 in that the display apparatus 3 includes a diffraction grating 34 (optical element) instead of the lenticular lens 14. The diffraction grating 34 diffracts incident light.

FIG. 8($b$) is a sectional view illustrating one example of the diffraction grating 34. FIG. 8($c$) is a sectional view illustrating another example of the diffraction grating 34. The diffraction grating 34 may be, for example, a diffraction grating having a rectangular wave shape in a section as shown in FIG. 8($b$). Alternatively, the diffraction grating 34 may be a blazed diffraction grating as shown in FIG. 8($c$). In a case where the diffraction grating 34 is a blazed diffraction grating, the shape of the diffraction grating 34 may be defined so as to use, for example, zero-order light and ±first-order light.

In the diffraction grating 34, a full width at half maximum of luminance in the x-direction on an emission surface side of the light of the CF substrate 13 is made twice or more the width of the sub-pixel, similar to the lenticular lens 14. On the other hand, a full angle at half maximum of the luminance in the y-direction of the light emitted from the diffraction grating 34 is preferably 30° or less.

Figure 9:
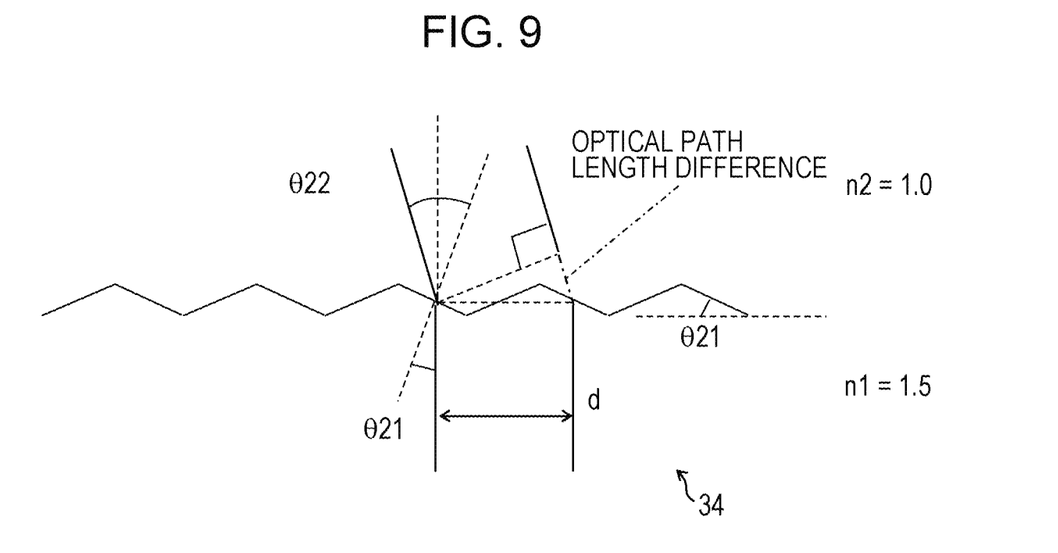
FIG. 9 is a sectional view illustrating still another example of a diffraction grating.

FIG. 9 is a sectional view illustrating still another example of the diffraction grating 34. The diffraction grating 34 may have, for example, a triangular wave shape as shown in FIG. 9. In a case where the diffraction grating 34 has a triangular wave shape, zero-order light and ±first-order light can be emitted efficiently.

The specific shape of the diffraction grating 34 will be considered below. In the first embodiment, an optical element for emitting light with an incident angle of 2.9° at an emission angle of 0.007° is considered. For the simplicity, it is assumed that light incident at an incident angle of 0° with respect to an envelope surface of a triangular wave of the diffraction grating 34 is emitted at an emission angle of 2.9°.

In FIG. 9, θ21 is an angle formed by the envelope surface of the triangular wave of the diffraction grating 34 and an interface of the diffraction grating 34. Further, θ21 is also an incident angle of light, perpendicular to the envelope surface, to the interface of the diffraction grating 34. Moreover, θ22 is an emission angle of the light emitted from the interface of the diffraction grating 34.

In a case where an optical path length difference is equal to a wavelength λ, that is, when the following Expression (11) is satisfied, intensity of the emitted light becomes stronger:

$$d \times \sin(\theta 22 - \theta 21) = \lambda \quad (11)$$

d is a lattice spacing of the diffraction prating 34.

Since an angle change between the incident light and the emitted light is 2.9°, θ22−θ21 is 2.9°. Considering in the same manner as in the first embodiment, θ21 is 8.7°, and θ22 is 5.8°. Assuming that the wavelength λ is 550 nm, which is a wavelength of the green light with high visibility, the lattice spacing d of 10.87 μm is obtained from the Expression (11).

The above-mentioned values for the diffraction grating 34 represent one of the preferred examples and do not limit the scope of the invention. In a case where the diffraction grating 34 has a triangular wave shape, the lattice spacing is preferably 3 μm to 25 μm. Further, it is preferable that an angle formed by the envelope surface of the diffraction grating 34 and the surface of the diffraction grating 34 be 3° to 10°. Consequently, the full width at half maximum of the luminance of the green light on an emission surface side of the diffraction grating 34 is made twice or more the width of the sub-pixel.

As the diffraction grating 34, a diffraction grating having a shape other than the above-described examples may be used. In addition, such a diffraction grating may be a diffraction grating using, for example, ±second or higher-order diffracted light. However, it is preferable to use, as the diffraction grating 34, a diffraction grating that uses interference between the zero-order light and the ±first-order light from the viewpoint that the shape of the diffraction grating is not made complicated and light can be efficiently used.

Fourth Embodiment

Another embodiment of the present disclosure will be described based on FIG. 10 as follows.

Figure 10:
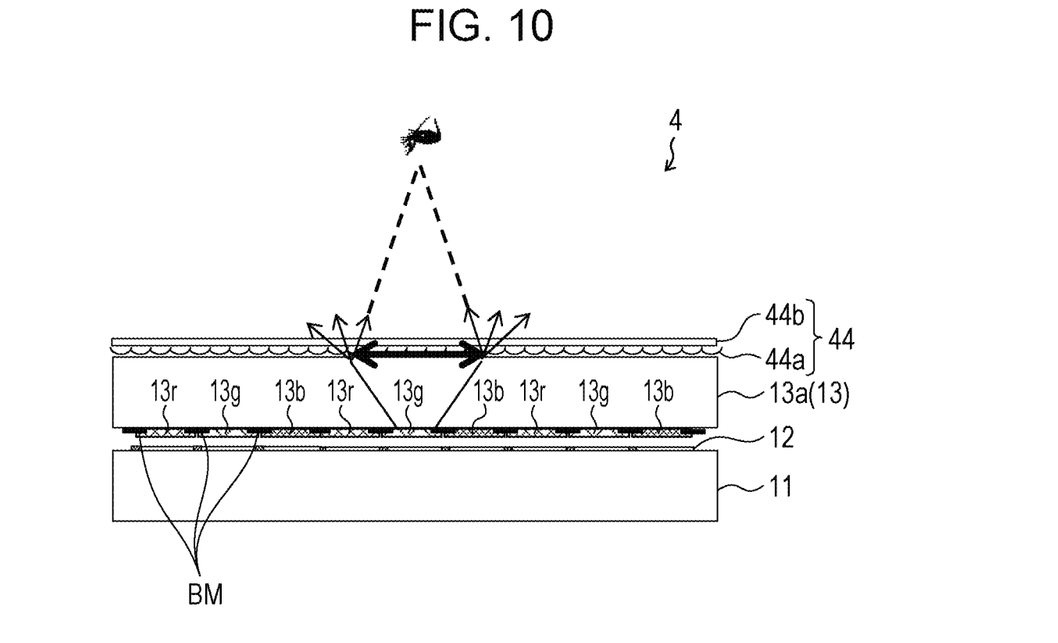
FIG. 10 is a sectional view illustrating a configuration of a display apparatus according to a fourth embodiment.

FIG. 10 is a sectional view illustrating a configuration of a display apparatus 4 according to the present embodiment. The display apparatus 4 is different from the display apparatus 1 in that the display apparatus 4 includes a lenticular lens 44 (optical element) instead of the lenticular lens 14.

In the lenticular lens 44, a plurality of lens elements 44$a$ extending in the y-direction are formed so as to be convex toward a light incident side on a surface of a glass substrate 44$b$ (light transmissive member) parallel to the CF substrate 13 and to be aligned in the x-direction. The lenticular lens 44 may be formed of a light transmissive material other than the glass.

Such a display apparatus 4 can also achieve the same effect as the display apparatus 1.

Fifth Embodiment

Another embodiment of the present disclosure will be described based on FIG. 11 as follows.

Figure 11:
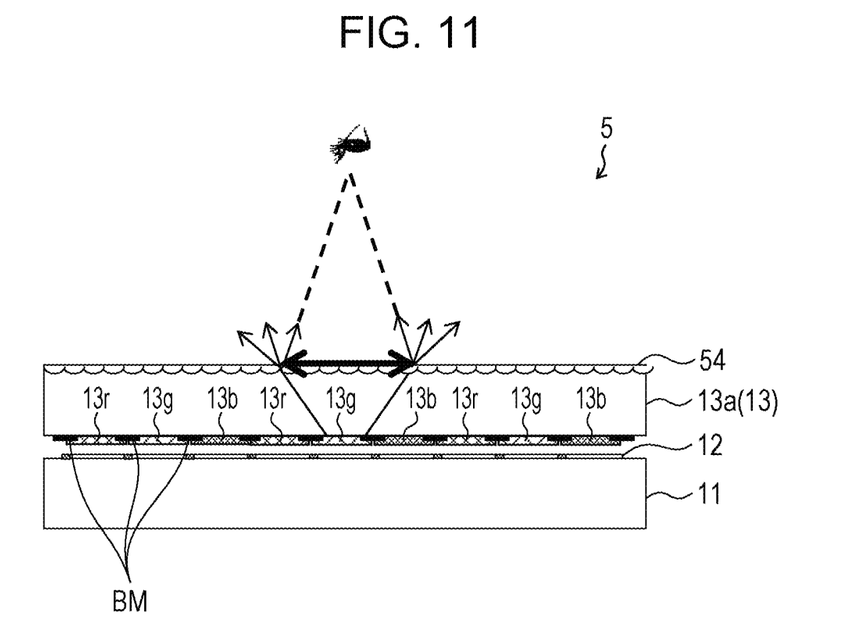
FIG. 11 is a sectional view illustrating a configuration of a display apparatus according to a fifth embodiment.

FIG. 11 is a sectional view illustrating a configuration of a display apparatus 5 according to the present embodiment. The display apparatus 5 is different from the display apparatus 1 in that the display apparatus 5 includes a lenticular lens 54 (optical element) instead of the lenticular lens 14. Unlike the lenticular lens 14 and the like, the lenticular lens 54 is a groove formed in a surface on the light emission side of the glass substrate 13a (light transmissive member) of the CF substrate 13 and extending in the y-direction. That is, the lenticular lens 54 is formed in a surface of the glass substrate 13a and is convex toward the light incident side. Alternatively, the lenticular lens 54 may be formed in a surface of a light transmissive member parallel to the CF substrate 13 and different from the glass substrate 13a.

Such a display apparatus 5 can also achieve the same effect as the display apparatus 1 and the like.

SUMMARY

A display apparatus (1, etc.) according to a first aspect the present disclosure is a display apparatus having a plurality of pixels and including: a color layer (CF substrate 13, etc.) that determines a color of a sub-pixel corresponding to a color element, for each of the plurality of pixels; and an optical element (lenticular lens 14, etc.) that is provided parallel to the color layer and widens a full width at half maximum of luminance of emitted light more than a full width at half maximum of luminance of light incident from the color layer, in which sub-pixels are arranged to have a periodicity in at least one direction, and the optical element has a periodic structure smaller than the periodicity of arrangement of the sub-pixels.

According to the configuration stated above, the display apparatus includes the color layer that determines the color of the sub-pixel corresponding to the color element of each pixel, and the optical element provided parallel to the color layer. The optical element emits light having the full width at half maximum wider than the full width at half maximum of the luminance of light incident from the color layer. Further, the sub-pixels are arranged to have the periodicity in at least one direction, and the optical element has the periodic structure smaller than the periodicity of arrangement of the sub-pixels. Therefore, it is possible to provide the display apparatus capable of suppressing screen-door effect without requiring alignment between the optical element and the pixel.

In the display apparatus according to a second aspect of the present disclosure, in the first aspect, the optical element may be a lenticular lens (14, 44, 54).

In the display apparatus according to a third aspect of the present disclosure, in the second aspect, the lenticular lens (14) may be formed to be convex toward a light emission side on a surface of a light transmissive member parallel to the color layer.

In the display apparatus according to a fourth aspect of the present disclosure, in the second aspect, the lenticular lens (44) may be formed to be convex toward a light incident side on a surface of a light transmissive member parallel to the color layer.

In the display apparatus according to a fifth aspect of the present disclosure, in the second aspect, the lenticular lens (54) may be formed in a surface of a light transmissive member parallel to the color layer, and may be convex toward a light incident side.

According to each of the configurations stated above, by the lenticular lens, it is possible to emit light having the full width at half maximum wider than the full width at half maximum of the luminance of light incident from the color layer.

In the display apparatus according to a sixth aspect of the present disclosure, in any one of the second to fifth aspects, it is preferable that the lenticular lens have a pitch of 1 μm to 25 μm in a periodic direction, a curvature of 20 μm to 2000 μm, and a height of 3 μm or less.

According to the configuration stated above, since the full width at half maximum of the light emitted from the lenticular lens is made twice the full width at half maximum of the incident light, the screen-door effect can be appropriately suppressed.

In the display apparatus according to a seventh aspect of the present disclosure, in the first aspect, the optical element may be a diffraction grating (34).

According to the configuration stated above, by the diffraction grating, it is possible to emit light having the full width at half maximum wider than the full width at half maximum of the luminance of light incident from the color layer.

In the display apparatus according to an eighth aspect of the present disclosure, in the seventh aspect, it is preferable that the diffraction grating have a triangular wave shape, a lattice spacing of 3 μm to 25 μm, and an angle formed by an envelope surface of the diffraction grating and a surface of the diffraction grating of 3° to 10°.

According to the configuration stated above, the same effect as that of the sixth aspect can be produced.

In the display apparatus according to a ninth aspect of the present disclosure, in the seventh or eighth aspect, it is preferable that the diffraction grating use interference between zero-order light and ±first-order light.

According to the configuration stated above, a shape of the diffraction grating is not made complicated and light can be efficiently used.

In the display apparatus according to a tenth aspect of the present disclosure, in any one of the first to ninth aspects, it is preferable that the periodic structure of the optical element be smaller than a width of a sub-pixel having a largest width in a direction of the periodicity of the sub-pixels.

According to the configuration stated above, the period of the periodic structure of the optical element is made sufficiently smaller than the period of the periodicity of the sub-pixels. Therefore, the screen-door effect can be suppressed more reliably.

In the display apparatus according to an eleventh aspect of the present disclosure, in any one of the first to tenth aspects, it is preferable that a rotation angle of the optical element in a periodic direction with respect to the plurality of pixels in a periodic direction, be −20° to +20°, the rotation angle being in a plane parallel to a plane on which the plurality of pixels are arranged.

According to the configuration stated above, occurrence of moire can be suppressed without degradation of the image quality.

A display apparatus according to a twelfth aspect of the present disclosure is a display apparatus having a plurality of pixels and including: a color layer that determines a color of a sub-pixel corresponding to a color element, for each of the plurality of pixels; and an optical element (anisotropic scattering member 24) provided parallel to the color layer, in which the optical element anisotropically scatters light incident from the color layer.

According to the configuration stated above, the same effect as that of the first aspect can be produced.

In the display apparatus according to a thirteenth aspect of the present disclosure, in the twelfth aspect, it is preferable that the optical element have a filler that scatters light and a matrix that seals the filler, a difference between a refractive index of the filler and a refractive index of the matrix be 0.1 or more, the filler have a short diameter of 0.1 µm or more and an aspect ratio of 10 to 1000, and the filler account for 50 mass % to 80 mass % of the optical element.

According to the configuration stated above, the same effect as that of the sixth and eighth aspects can be produced.

In the display apparatus according to a fourteenth aspect of the present disclosure, in any one of the first to thirteenth aspects, the color layer that determines a color of the pixel may be a color filter (CF substrate 13).

According to the configuration stated above, the color of the sub-pixel can be determined by the color of the color filter.

In the display apparatus according to a fifteenth aspect of the present disclosure, in the fourteenth aspect, it is preferable that a light source that causes light to be incident on the color layer be further provided, and light emitted from the light source have a full angle at half maximum of luminance of 30° or less at least in a direction of the periodicity of arrangement of the sub-pixels.

According to the configuration stated above, it is less likely that the color mixing of light emitted from the sub-pixel and light of the adjacent sub-pixel occurs, and thus the image quality can be improved.

In the display apparatus according to a sixteenth aspect of the present disclosure, in any one of the first to thirteenth aspects, the color layer (TFT/OLED substrate 16) that determines a color of the pixel may have a function of emitting light by itself.

According to the configuration stated above, since it is not necessary to separately provide a light source, the number of components of the display apparatus can be reduced.

In the display apparatus according to a seventeenth aspect of the present disclosure, in the sixteenth aspect, it is preferable that the light emitted from the color layer have a full angle at half maximum of luminance of 30° or less in a direction of the periodicity of arrangement of the sub-pixels.

According to the configuration stated above, the same effect as that of the fourteenth aspect can be produced.

In the display apparatus according to an eighteenth aspect of the present disclosure, in any one of the first to seventeenth aspects, it is preferable that the color layer include a black matrix, which prevents color mixing, between the sub-pixels, and a width of the black matrix in a direction perpendicular to a periodic direction of the sub-pixels be 10 µm or less, or 30% or less of a length of one period of the sub-pixel.

According to the configuration stated above, it is possible to reduce the screen-door effect due to the black matrix in the direction perpendicular to the periodic direction of the sub-pixel.

A head mount display according to a nineteenth aspect of the present disclosure includes the display apparatus according to any one of the first to eighteenth aspect.

According to the configuration stated above, the same effect as that of the first aspect can be produced.

The present disclosure is not limited to the above-described embodiments, and various modifications can be made within the scope of the claims, and embodiments obtained by appropriately combining the technical solutions disclosed in the different embodiments also fall within the technical scope of the present disclosure. Furthermore, new technical features can be formed by combining the technical solution disclosed in each embodiment.

[Another Implementation of the Present Disclosure]

The one aspect of the present disclosure can also be expressed as follows.

That is, a display apparatus according to one aspect of the present disclosure includes a layer (referred to as a color layer) that determines a color of a pixel, and arrangement of pixels (sub-pixels) that are color elements (R, G, and B, or R, G, B, and W) has a periodicity in at least one direction (referred to as a color arrangement period). An optical element having a function of scattering light in a periodic direction of the color arrangement or within ±20° from the periodic direction of the color arrangement is provided on a light emission side relative to the color layer. This optical element and the pixel do not have one-to-one correspondence, and highly accurate alignment is unnecessary. With this configuration, the full width at half maximum of the luminance of the sub-pixel is made twice or more than an original width of the sub-pixel in an orientation widened by the optical element when viewed from the observer.

In addition, in the display apparatus according to one aspect of the present disclosure, the optical element uses a lenticular lens, and the period thereof is smaller than the color arrangement period.

Additionally, in the display apparatus according to one aspect of the present disclosure, the period of the lenticular lens is desirably smaller than that of the color element (sub-pixel) with the largest width.

Further, in the display apparatus according to one aspect of the present disclosure, the lenticular lens is on the glass and is convex toward the light emission side.

Further, in the display apparatus according to one aspect of the present disclosure, the lenticular lens is on the glass and is convex toward the light incident side.

Further, in the display apparatus according to one aspect of the present disclosure, the lenticular lens is in a glass surface obtained by etching the glass and is convex toward the light incident side.

Further, in the display apparatus according to one aspect of the present disclosure, the optical element is anisotropic scattering member, and a full angle at half maximum of a scattering luminance is within ±30°.

Further, in the display apparatus according to one aspect of the present disclosure, in the anisotropic scattering member, a full angle at half maximum of a scattering luminance is within ±10°.

Further, in the display apparatus according to one aspect of the present disclosure, the optical element is a diffraction grating that diffracts in one direction only.

Further, in the display apparatus according to one aspect of the present disclosure, a color period is desirably smaller than a size of the color element.

Further, in the display apparatus according to one aspect of the present disclosure, the diffraction grating uses zero-order light and ±first-order light.

Further, in the display apparatus according to one aspect of the present disclosure, the layer which determines a color of the pixel is a color filter.

Further, in the display apparatus according to one aspect of the present disclosure, light (light from the backlight or light from the light emitting layer) incident on the color filter is narrow directional, of which a full angle at half maximum of the luminance is 30° or less in at least one orientation.

Further, in the display apparatus according to one aspect of the present disclosure, the layer which determines a color of the pixel is a self-emitting layer.

Further, in the display apparatus according to one aspect of the present disclosure, luminance viewing angle characteristic due to light emission of the self-emitting layer is narrow directional, of which a full angle at half maximum of the luminance is 30° or less in at least one orientation.

In the display apparatus according to one aspect of the present disclosure, a BM width is 10 μm or less, or 30% or less of a pixel pitch in a direction perpendicular to the periodic direction of the color arrangement.

Further, the display apparatus according to one aspect of the present disclosure is an HMD using the technology described above.

REFERENCE SIGNS LIST 1, 1A, 2, 3: display apparatus
11: backlight (light source)
13: CF substrate (color layer or color filter)
14, 44, 54: lenticular lens (optical element)
16: TFT/OLED substrate (color layer)
24: anisotropic scattering member (optical element)
34: diffraction grating (optical element)

The invention claimed is:

1. A display apparatus having a plurality of pixels, comprising:
  a color layer that determines a color of a sub-pixel corresponding to a color element, for each of the plurality of pixels;
  an optical element that is provided parallel to the color layer and widens a full width at half maximum of luminance of emitted light more than a full width at half maximum of luminance of light incident from the color layer; and
  a light source that causes light to be incident on the color layer, wherein
  the color layer that determines a color of the sub-pixel is a color filter,
  sub-pixels are arranged to have a periodicity in at least one direction,
  the optical element has a periodic structure smaller than the periodicity of arrangement of the sub-pixels, and
  light emitted from the light source has a full angle at half maximum of luminance of 30° or less at least in a direction of the periodicity of arrangement of the sub-pixels.

2. The display apparatus according to claim 1, wherein the optical element is a lenticular lens.

3. The display apparatus according to claim 1, wherein the optical element is a diffraction grating.

4. The display apparatus according to claim 1, wherein the periodic structure of the optical element is smaller than a width of a sub-pixel having a largest width in a direction of the periodicity of arrangement of the sub-pixels.

5. The display apparatus according to claim 1, wherein a rotation angle of the optical element in a periodic direction with respect to the plurality of pixels in a periodic direction is −20° to +20°, the rotation angle being in a plane parallel to a plane on which the plurality of pixels are arranged.

6. A display apparatus having a plurality of pixels, comprising:
  a color layer that determines a color of a sub-pixel corresponding to a color element, for each of the plurality of pixels; and
  an optical element that is provided parallel to the color layer and widens a full width at half maximum of luminance of emitted light more than a full width at half maximum of luminance of light incident from the color layer, wherein
  sub-pixels are arranged to have a periodicity in at least one direction,
  the optical element has a periodic structure smaller than the periodicity of arrangement of the sub-pixels,
  the color layer that determines a color of the sub-pixel has a function of emitting light by itself, and
  the light emitted from the color layer has a full angle at half maximum of luminance of 30° or less at least in a direction of the periodicity of arrangement of the sub-pixels.

7. A display apparatus having a plurality of pixels, comprising:
  a color layer that determines a color of a sub-pixel corresponding to a color element, for each of the plurality of pixels; and
  an optical element that is provided parallel to the color layer and widens a full width at half maximum of luminance of emitted light more than a full width at half maximum of luminance of light incident from the color layer, wherein
  sub-pixels are arranged to have a periodicity in at least one direction,
  the optical element has a periodic structure smaller than the periodicity of arrangement of the sub-pixels,
  the color layer includes a black matrix, which prevents color mixing, between the sub-pixels, and
  a width of the black matrix in a direction perpendicular to a periodic direction of the plurality of pixels is 10 μm or less, or 30% or less of a length of one period of the sub-pixel.

8. A head mount display, comprising
  the display apparatus according to claim 1.

9. The display apparatus according to claim 6, wherein the optical element is a lenticular lens.

10. The display apparatus according to claim 6, wherein the optical element is a diffraction grating.

11. The display apparatus according to claim 6, wherein the periodic structure of the optical element is smaller than a width of a sub-pixel having a largest width in a direction of the periodicity of arrangement of the sub-pixels.

12. The display apparatus according to claim 6, wherein a rotation angle of the optical element in a periodic direction with respect to the plurality of pixels in a periodic direction is −20° to +20°, the rotation angle being in a plane parallel to a plane on which the plurality of pixels are arranged.

13. A head mount display, comprising
  the display apparatus according to claim 6.

14. The display apparatus according to claim 7, wherein the optical element is a lenticular lens.

15. The display apparatus according to claim 7, wherein the optical element is a diffraction grating.

16. The display apparatus according to claim 7, wherein the periodic structure of the optical element is smaller than a width of a sub-pixel having a largest width in a direction of the periodicity of arrangement of the sub-pixels.

17. The display apparatus according to claim 7, wherein a rotation angle of the optical element in a periodic direction with respect to the plurality of pixels in a periodic direction is −20° to +20°, the rotation angle being in a plane parallel to a plane on which the plurality of pixels are arranged.

18. A head mount display, comprising the display apparatus according to claim 7.

* * * * *